United States Patent
Konstantinov

(10) Patent No.: US 8,994,442 B2
(45) Date of Patent: Mar. 31, 2015

(54) SWITCHING CIRCUIT AND CONTROLLER CIRCUIT

(71) Applicant: Fairchild Semiconductor Corporation, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/920,862

(22) Filed: Jun. 18, 2013

(65) Prior Publication Data

US 2013/0342262 A1 Dec. 26, 2013

Related U.S. Application Data

(60) Provisional application No. 61/662,648, filed on Jun. 21, 2012.

(51) Int. Cl.
*H03K 17/60* (2006.01)
*H03K 17/0414* (2006.01)
*H03K 17/16* (2006.01)

(52) U.S. Cl.
CPC .......... *H03K 17/0414* (2013.01); *H03K 17/164* (2013.01)
USPC .......................................... 327/433; 327/439

(58) Field of Classification Search
USPC .......................................... 327/433, 439, 513
See application file for complete search history.

(56) References Cited

U.S. PATENT DOCUMENTS

| | | | | |
|---|---|---|---|---|
| 3,761,799 A * | 9/1973 | Shuey | ........................... | 323/270 |
| 4,366,522 A | 12/1982 | Baker | | |
| 4,906,904 A * | 3/1990 | Tognoni | ....................... | 315/408 |
| 5,262,932 A | 11/1993 | Stanley et al. | | |
| 6,049,108 A * | 4/2000 | Williams et al. | ............... | 257/341 |
| 6,278,314 B1* | 8/2001 | Asplund et al. | ............... | 327/427 |
| 6,392,463 B1* | 5/2002 | Kitagawa et al. | ............. | 327/309 |
| 6,504,208 B2* | 1/2003 | Bosco et al. | .................. | 257/341 |
| 6,822,842 B2* | 11/2004 | Friedrichs et al. | ............ | 361/111 |
| 7,034,345 B2* | 4/2006 | Chang et al. | .................. | 257/177 |
| 7,453,308 B2* | 11/2008 | Tihanyi | ........................ | 327/309 |
| 7,741,883 B2* | 6/2010 | Fuller et al. | .................... | 327/108 |
| 8,017,981 B2* | 9/2011 | Sankin et al. | ................. | 257/265 |
| 8,456,198 B2* | 6/2013 | Summer | ....................... | 327/108 |
| 8,599,585 B2* | 12/2013 | Yasuoka et al. | ................. | 363/37 |
| 2010/0214710 A1* | 8/2010 | Kora | ............................. | 361/101 |
| 2011/0310645 A1* | 12/2011 | Godo | ......................... | 363/56.12 |
| 2012/0262220 A1* | 10/2012 | Springett | ....................... | 327/430 |
| 2013/0016542 A1* | 1/2013 | Nakamura et al. | ......... | 363/56.01 |
| 2013/0120030 A1* | 5/2013 | Kora | ............................. | 327/109 |
| 2014/0241015 A1* | 8/2014 | Barauna et al. | ................. | 363/37 |

* cited by examiner

*Primary Examiner* — Thomas J Hiltunen

(57) ABSTRACT

New designs of high power switching circuits and controller circuits are provided. Principal silicon bipolar switch is connected in parallel to snubber switch that is formed of a wide bandgap material. The snubber switch is activated during at least one of turn-on and turn-off of the principal silicon switch so as to minimize (or reduce) the switching loss and to bypass safe operation area limitations.

19 Claims, 2 Drawing Sheets

SWITCHING CIRCUIT AND CONTROLLER CIRCUIT

RELATED APPLICATION

This application claims priority to and the benefit of application No. 61/662,648, entitled, "Switching Circuit and Controller Circuit", filed on Jun. 21, 2012, which is incorporated herein by reference in its entirety.

FIELD

The present disclosure relates to the field of power devices, switching circuits and controller circuits, in particular for high power high voltage applications. The power devices may operate at least up to 600 Volts of blocked voltage and have a rating of at least approximately 10 Amperes (10 A) under on-state conditions. In particular, the disclosure relates to minimization of on-state and switching losses in high voltage high power switches (and diodes).

BACKGROUND

Silicon-based bipolar power switching devices such as insulated-gate bipolar transistors (IGBTs), bipolar junction transistors (BJTs) or thyristors like gate turn-off thyristors (GTOs) or metal-oxide-semiconductor (MOS) controlled thyristors (MCTs) have high blocking voltages and low direct current (DC) power losses due to conductivity modulation. Silicon (Si) bipolar devices are generally the preferred technology for high voltage high power conversion circuits, which require power switches having blocking voltages of approximately 600 V or higher.

However, the switching losses of Si bipolar power devices are relatively high. The turn-off loss of Si bipolar devices is high since extraction of stored minority carrier charge occurs under high voltage conditions. The turn-on loss can also be substantial due to the time it takes for the entire device thickness to be flooded with minority carriers upon turn-on. Further, high density carrier plasma in such devices is often unstable under the conditions of high electric field due to avalanche multiplication.

Generally, it would be advantageous to prevent excessive switching losses in silicon bipolar devices, as well as to protect them from instability due to simultaneous high-current high-voltage operation.

Thus, there is a need for providing new designs of solid-state devices and circuits, and of controller circuits thereof that would alleviate, or at least mitigate, some of the above-mentioned drawbacks.

SUMMARY

The present disclosure is related to alleviation of at least some of the above mentioned drawbacks of the prior art and to provide an improved alternative to prior art (high voltage) silicon-based switching circuits and devices.

In particular, at least some embodiments are related to decreasing the switching losses in high power high voltage silicon bipolar switching devices.

At least some embodiments are related to preventing silicon bipolar device instability due to simultaneous high-current high-voltage operation.

These and other embodiments may be at least partly achieved by a switching circuit and a controller circuit.

BRIEF DESCRIPTION OF THE DRAWINGS

The above features and advantages of the embodiments described herein, will be better understood through the following illustrative and non-limiting detailed description of embodiments, with reference to the appended drawings, in which.

Figure 1:
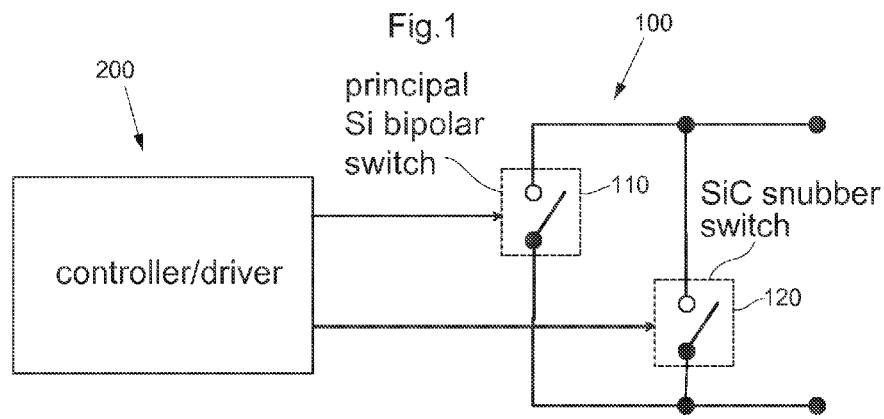
FIG. 1 shows a schematic view of a switching circuit according to an embodiment.

All the figures are schematic, not necessarily to scale, and generally show parts which are necessary in order to elucidate embodiments, wherein other parts may be omitted or merely suggested.

DETAILED DESCRIPTION

According to at least a first general aspect, a switching circuit is provided. The switching circuit includes a first silicon-based switching device (also referred to as the principal switch or operative switching device in the following) and a second switching device (also referred to as the snubber or snubber switch in the following) including a wide bandgap semiconductor material (such as silicon carbide or a Group III nitride, as will be further described below). The first switching device and the second switching device are connected in parallel.

This can be advantageous in overcoming high switching losses and carrier plasma instabilities in silicon-based switching devices, such as in silicon (Si) bipolar switches. The switching circuit or device includes first and second switching devices connected in parallel and may be referred to as a composite switch.

The first switching device may be referred to as the principal silicon bipolar switch and the second switching device may be a fast (relative to the switching speed of the first switching device) snubber switch, e.g. including silicon carbide. The snubber switch may be activated (i.e. turned on) at least during the turn-off of the principal switch so as to clamp the high collector potential of the principal bipolar switch to a low value.

As will be further explained below, the snubber switch may also be activated during turn-on of the principal switch.

Via the second switching device (snubber switch), and in particular its snubbing effect, the resulting switching circuit becomes less subject to damage from e.g. peak power dissipation during turn-on and turn-off in switching high currents from e.g. a high-voltage supply, although the first switching device may be subject to damage from such peak power dissipation.

According to one configuration, the output terminal of the first switching device (or principal Si bipolar switch) is electrically connected to the output terminal of the second switching device (or snubber switch) and the input terminal of the first switching device (or principal Si bipolar switch) is electrically connected to the input terminal of the second switching device (or snubber switch). These output and input terminals are used for applying an operating voltage to the first and second switching device in order to implement switching operation of the switching circuit. In other words, the main current path of the first switching device is connected in parallel with the main current path of the second switching device.

With respect to wide band gap semiconductor materials for the snubber switch, much faster high voltage switching than that available with silicon bipolar devices can be achieved utilizing wide bandgap (WBG) semiconductor materials such as silicon carbide (SiC) or Group III nitrides. Such materials have a bandgap which is wider than that of Si and present significant advantages over silicon due to e.g. their extremely high breakdown field, which is approximately 10 times higher than the breakdown field in silicon for both silicon carbide and group III nitrides.

Two types of WBG semiconductor materials are envisaged for fabrication of high voltage high power devices according to some embodiments. The first group of WBG semiconductor materials is represented by the hexagonal polytypes (crystal modifications) of silicon carbide, SiC. Of those polytypes, the 4H SiC polytype is preferable for manufacture of high power high voltage switching circuits as it presents the most favorable combination of high electron mobility and high breakdown field. The second group of WBG semiconductor materials for power device application is represented by Gallium Nitride (GaN) and its alloys with Aluminum Nitride (AlN), with Indium Nitride (InN), or with both AlN and InN. The GaN-based alloys will be further referred to as AlGaInN.

In the following, because of their advantageous properties and/or available crystal size and quality for high-voltage high power device applications, 4H-SiC and AlGaInN are for instance envisaged as WBG materials. It will be appreciated that other WBG semiconductor materials providing the same advantages for high-voltage high power device applications may be envisaged.

The voltage-withstanding region of a wide bandgap semiconductor material can be 10 times thinner (or a shorter one for a lateral device design) than the voltage withstanding region in silicon. In addition, the majority carrier charge of a voltage withstanding region in a wide bandgap material device can be approximately 10 times higher than the majority carrier charge of a voltage withstanding region in silicon. Conductance of the voltage-withstanding layer may therefore be 100 times higher than conductance of a majority-carrier silicon device of the same area and of the same voltage rating.

Although the maximum power levels available with WBG switching technologies is low compared to silicon because available chips are much smaller than that for silicon, in particular since the density of defects (e.g. "killer defects") in WBG materials is prohibitively high in large-area devices, very high switching speed may be achieved in power switching devices utilizing WBG materials. For silicon carbide, fast high-power switching may be achieved for bipolar junction transistors (BJTs), for vertical MOSFETs and for vertical JFETs. Power AlGaInN devices may be based on different variants of a lateral type heterojunction FET design. In the present application, the lower boundary of high voltage applications may be defined to be approximately 1000 Volts.

In some embodiments, the chip size and current rating of the snubber switch may be selected for maintaining the same on-state current as the rated current of the principal switch provided the on-state voltage drop of the snubber switch under pulsed operation conditions is approximately between 1.5 and 10 times the on-state voltage drop of the principal switch at the rated current of said principal switch.

According to a second general aspect, a controller circuit is provided. The controller circuit is connectable to a switching circuit as defined in accordance with the first aspect or as defined in any of the embodiments described in the following. The controller circuit is configured to activate the second switching device during turn-on and/or turn-off of the principal switch (i.e. the first switching device).

The controller circuit might include the driver stages either within the same chip or as standalone circuit components.

Both the turn-on and the turn-off of the principal switch may proceed under the conditions of low terminal voltage, because terminal bias is clamped by the on-state snubber switch during both of transients corresponding to the turn-on and the turn-off times. The switching losses in the principal switch are reduced (and preferably minimized) since dissipated power is the product of current by voltage. The switching losses of the snubber switch may be low due to its fast turn-on and turn-off that is inherent to WBG switches.

The snubber switch may operate during only a (small) portion of the total turn-on time of the composite switch. The pulsed operation of the snubber switch alleviates thermal limitations that are inherent to WBG devices. The current density in the WBG snubber can be selected to be much higher than that available for standalone operation of a WBG switch in a switch-mode power converter.

The composite switch according to embodiments has several advantages over standalone bipolar silicon and WBG components. For example, the switching losses of the principal silicon-based power switch are decreased because the turn-on may occur under near zero-voltage conditions, whereas the turn-off may occur under near zero-current conditions.

Some embodiments are advantageous in that conventional restrictions on the safe operation area (SOA) of the silicon switch are relaxed because the high-density carrier plasma is no longer exposed to high electrical field. As a result, optimizing, or at least improving, the bipolar switch design for achieving low on-state resistance that would otherwise be unacceptable due to the SOA restrictions is possible. The on-state DC losses of the principal switch can be also decreased as a result.

Further, the current levels available in the WBG snubber switch are higher than the currents available using the same WBG switch as a standalone switching device. Such higher currents result in increased on-state voltage of the WBG snubber switch. However, the total on-state time of the snubber switch may be much shorter than the on-state time of the principal switch; thus, increased voltage drop at the snubber does not substantially affect the total energy loss.

On the other hand, the WBG component of the composite switch can use much smaller chip size than that required for conventional power converter design using only WBG power switch. In addition to improvement of the economical aspect in that the size of the WBG component is reduced, some embodiments are advantageous in that building of high-power electrical conversion systems not available with the current state of WBG technology due to limited chip size is facilitated.

For control of the components or devices of the switching circuit, the controller circuit may be equipped with at least one sensing probe. For example, a current sense can be provided so as detect short circuit conditions in the load in a timely manner. According to an embodiment, the principal switch may be a silicon BJT or a silicon insulated-gate bipolar transistor (IGBT).

According to another embodiment, the snubber switch may include at least one of a SiC bipolar junction transistor (BJT), a SiC junction field-effect transistor (JFET), a SiC metal semiconductor field-effect transistor (MESFET), a SiC metal-oxide-semiconductor field-effect transistor (MOSFET) and a SiC insulated-gate bipolar transistor (IGBT).

According to another embodiment, the snubber switch may be a AlGaInN heterojunction field-effect transistor, which may also be referred to as a GaN-based heterojunction field-effect transistor (since the AlGaInN compositions employed in the transistors have GaN as the dominant component of binary or ternary alloy).

According to an embodiment, the snubber switch may include a cascode circuit comprising a (normally on) WBG field-effect transistor and a second (low voltage) (normally off) component based on silicon. In particular, the second component may be a low voltage normally off MOSFET. Serial connection of a normally off component provides additional safety features, which is advantageous in high power applications.

According to an embodiment, the low-voltage silicon MOSFET may have a source terminal and a drain terminals clamped by a Zener diode.

According to an embodiment, the first switching device may be implemented in a first chip and the second switching device may be implemented in a second chip, the chips being arranged as a hybrid assembly in a package. In other words, a hybrid packaged component may be provided including a chip with the snubber switch and a chip with the principal switch, the two chips being connected in parallel as a hybrid assembly. The package may be provided with two leads for connecting anodes and cathodes of the switches, as well as two leads for the control electrodes. The control electrode is, in this case, a generic name that stands for a gate if the switch is voltage controlled or stands for the base if the switch is a BJT.

According to an embodiment, a hybrid component including a chip with the snubber switch and a chip with the principal switch may be provided, the two chips being connected in parallel. Further, the hybrid component may include an antiparallel rectifier diode. The antiparallel diode connection means a parallel circuit connection, however with the direction of the on-state diode current that is opposite to the direction of the switch on-state current. The three devices (first switching device, second switching device and antiparallel diode) may be packaged in a single physical package as a hybrid assembly. The package may be provided with two leads for connection of the anodes and cathodes of the switches, as well as two leads for connection of the control electrodes.

According to an embodiment, a switching system comprising at least two switching devices as defined in any one of the preceding embodiments is provided. For example, six identical circuits may be co-packaged in a module as a hybrid assembly. Each of the switching circuits may include a principal silicon bipolar switch and a snubber switch connected in parallel, and optionally an anti-parallel connected rectifier diode, as defined above in the preceding embodiments. The package may be provided with leads for connection of the anodes and cathodes of the switches, as well as leads for connection of the control electrodes for each of the six circuits.

Referring more specifically to the controller circuit as defined in the second aspect, the controller circuit may, according to one embodiment, be configured to activate the second switching device at least during a period corresponding to one to several times the lifetime of minority carriers in the first switching device.

According to an embodiment, the controller circuit may be configured to, upon turn-on of the first switching device, activate the second switching device for a period lasting at least during one quarter of time, and preferably for a period equal to, the turn-on period of the first switching device. The present embodiment is advantageous in that the controller circuit may be configured to activate the second switching device during the time required for injection of carriers in the first switching device so as to avoid overshoot of the on-state voltage of the first switching device.

According to an embodiment, the controller circuit may be configured to increase duration of the turn-on period of the second switching device with increase of the junction temperature of the first switching device.

It will be appreciated that the controller circuit may advantageously be configured to detect the conditions for excessive forward drop for any of the switching devices. A feedback loop may be provided between the switching circuit and the controller circuit. According to a further aspect, a switch-mode electrical power conversion device is provided. The switch-mode electrical power conversion device includes a switching circuit or switching system as defined in any one of the preceding embodiments and a controller circuit as defined in any one of the preceding embodiments.

Further features of, and advantages with, the embodiments will become apparent when studying the following detailed disclosure, the drawings and the appended claims. Further, it will be appreciated that different features can be combined to create embodiments other than those described in the following.

With reference to FIG. 1, there is shown a schematic view of a switching circuit in accordance with an exemplifying embodiment.

FIG. 1 shows a switching circuit 100 comprising a first switching device 110 acting as the principal switch and a second switching device 120 acting as a snubber. In the present example, the snubber switch 120 is a fast switch, which may be a SiC BJT. However, the snubber switch 120 may also be a JFET, a MESFET, a MOSFET, or an IGBT, preferably including SiC such that switching of the snubber switch is very fast. Indeed, SiC provides a high breakdown field that results in very thin drift regions in SiC power devices. In addition, for SiC devices the safe operation area (SOA, i.e. the region free from plasma instability under high electric field conditions) is extremely wide, which in most cases eliminates (or at least significantly reduces) the concerns with respect to stability of the SiC device under turn-on and turn-off conditions. This also applies to the silicon carbide BJT, which has very small stored minority carrier charge in comparison to other power devices.

If the second switching device 120 (i.e. the snubber) is based on SiC technology and a normally on-FET, then the safety considerations dictate a cascode circuit with a low-voltage MOSFET as the second component of the cascode circuit. The low-voltage MOSFET may not necessarily be made of SiC and may include other semiconductor materials, such as e.g. Si. The low-voltage MOSFET will not impair the switching speed of the switching circuit since any transient is governed by the high-voltage component.

Further, a controller or driver 200 may be connected to the switching circuit 100 for controlling operation of the snubber switch 120. The controller may be configured to turn on or off the snubber switch in accordance with a particular scheme, which will be described in more detail in the following. For this purpose, each of the first and second switching devices 110 and 120 of the switching circuit 100 may include control input terminals for receiving control signals from the driver 200.

Figure 2:
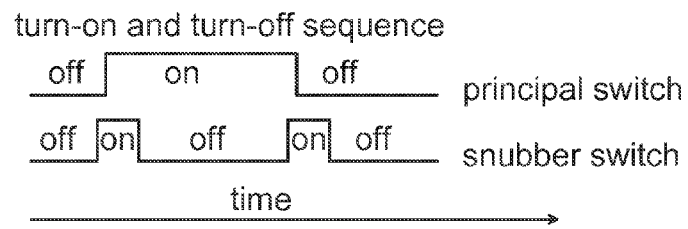
FIG. 2 shows a turn-on and turn-off sequence for a switching circuit according to an embodiment.
Figure 3:
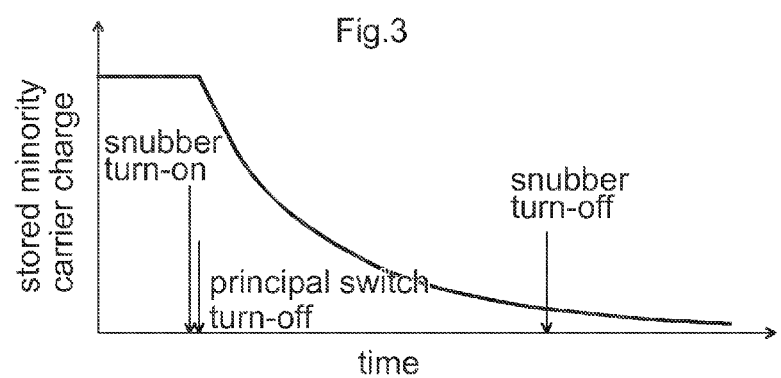
FIG. 3 is a graph illustrated the level of stored minority charge carrier in a switching circuit as a function of time in accordance with an embodiment.

Referring to FIGS. 2 and 3, the silicon carbide switch 120 may be activated (turned on) during turn-on and turn-off of the principal switch, whereas the pulse length is T1 and T2 for first and second on-state periods, respectively. For the principal switch turn-off, the timing provides (at least nearly) full clamping of the supply voltage by the open-state snubber switch 120 before the minority carrier charge in the principal switch 110 is considerably decreased. The clamping turn-off pulse length T2 of the snubber switch 120 may preferably be one to several times the lifetime of minority carriers in the principal bipolar switch 110. After the turn-off of the snubber switch 120, the reverse voltage recovery occurs under the conditions of very low minority carrier charge, which prevents development of instability of free carrier plasma due to avalanche multiplication as well as dissipation of excessive power.

The turn-on of the principal silicon bipolar switch is generally not as disadvantageous from the viewpoint of possible damage to the component due to carrier plasma instability, because the terminal voltage of the bipolar switch is rapidly decreasing during the turn-on. On the other hand, the power losses during the turn-on are comparable to those during the turn-off. One reason for the high turn-on loss is elevated on-state voltage of the bipolar switch immediately after the turn-on, so-called on-state voltage overshoot. It takes certain time to minority carriers for getting distributed over entire thickness of the voltage withstanding layer. It is during the carrier redistribution time that the dynamic on-state voltage is much higher than the steady-state voltage for the same current. The carrier redistribution time in a bipolar device is typically comparable to the minority carrier lifetime. It is therefore preferred that the turn-on pulse duration T2 is at least between ¼ and ½ of the turn-off pulse.

It is further preferred that duration of snubber switch on-state during the turn-on of the principal switch, T1 is comparable to that for the turn-off, T2.

According to an embodiment, the controller 200 may be configured such that the snubber switch 120 may be kept off-state or near off-state between turn-on and turn-off snubber pulses (i.e. between the times of turning on and turning off of the switching circuit). In other words, the snubber device 120 may be activated (or used) only at the time intervals when it is ultimately required for minimum power dissipation (i.e. the snubber is turned off when it is not ultimately required). The present embodiment is advantageous in that it alleviates thermal limitations, which may be associated with SiC switch technology since electron mobility in SiC is rapidly decreased with increasing temperature. Using the snubber switch 120 as a partial bypass for the principal switch current during an entire turn-on period of the first switching device 110 may increase the on-state resistance of the snubber switch 120 and result in increased power loss during turn-on and turn-off snubber pulses, when high current is required. Limiting the on-state of the snubber switch 120 to the turn-on and turn-off of the first switching device (i.e. maintaining the snubber switch off-state between turn-on and turn-off pulses) is also particularly advantageous if a SiC BJT is used as the snubber switch since, otherwise, it would become too hot and thereby lose a part of current gain and also consume high base current during the Si conduction cycle. Thus, with the present embodiment, a more reliable switching device is provided as power dissipation is restricted (in particular power dissipation via the snubber switch 120 is restricted during the Si device transients).

Further, embodiments are particularly advantageous at high voltages, e.g. for ratings of 1000V and more, at which the problems with reverse recovery are most acute.

It will be appreciated that the functions of the controller circuit are not limited to turning on or off the switching components in pre-determined time. The controller may preferably regulate the turn-on time (pulse width) and phase of the principal switch so as to deliver desired power into the load. The power conversion circuit utilizing the composite switch may also be configured to return the energy accumulated in the load, such as an electric motor, back to the power supply network. A typical controller may advantageously include certain feedback elements, such as current and voltage senses that are placed at power input and power output of the power conversion circuit. Voltage and current sensors might be also placed in in the vicinity of the power switching components, for example, to detect excessive forward voltage drop. A controller may also advantageously include certain safety functions, such as turning off the power switches under the overload conditions so as to shut down the converter under control in a timely manner if the overload conditions occur. Such controller functions are generic for any controller of a high power conversion circuit. Certain additional possibilities, however, exist for improving or optimizing the operation of the composite switch, which are not specific to conventional design architecture.

The principal bipolar switch may be provided with a temperature sensor. The controller may then be further configured to increase the duration of both T1 and T2 with increasing principal switch temperature so as to account for the increase of minority carrier lifetimes in silicon with increasing junction temperature.

Figure 4:
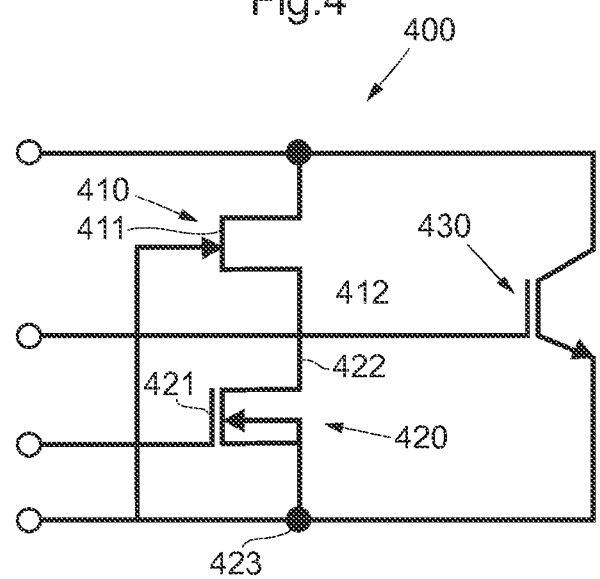
FIG. 4 shows a circuit representing a composite switch design including a cascode connection of the snubber switch according to an embodiment.

Referring to FIG. 4, a switching circuit according to an embodiment is described.

FIG. 4 shows a composite switch with a silicon carbide JFET 410, a Si IGBT 430 and, via a cascode connection, a silicon LV (low voltage) MOSFET 420. The normally on-state SiC JFET switch 410 is provided a cascode connection to a low voltage silicon MOSFET 420 so as to ensure normally off operation of the resulting circuit. A positive bias at the MOSFET gate 421 of the MOSFET 420 opens both the JFET 410 and the MOSFET 420. Zero bias at the gate 421 of the MOSFET 420 will close the MOSFET 420. The potential of the JFET source 412 will exceed JFET gate 411 potential by the maximum voltage the low-voltage MOSFET 420 can block. With appropriate choice of the MOSFET, reliable off-state of the high voltage JFET can be achieved even if it turns out that no power is available for the driver of the SiC snubber switch 410. It is preferred that the MOSFET 420 has a built-in Zener diode function so as to maintain substantially constant maximum voltage, as well as withstand the avalanche conditions without damage. If the latter is not the case with the chosen MOSFET then an external silicon MOSFET can be provided for clamping source and drain electrodes 422 and 423 of the MOSFET 420. The same cascode circuit can be utilized for driving a GaN-based normally on-state FET.

It is a further advantage to have both principal and snubber components of the composite switch mounted in the same package. Such a co-packaging will reduce the packaging costs as well as minimize the voltage offset between two parallel components, which are difficult to eliminate if principal and snubber switches are mounted into separate packages. With high current levels and fast transients of around tens of nanoseconds the transient voltage offsets between two components may account to more than a hundred Volts due to the parasitic lead inductance. Such a parasitic inductance can be minimized or at least reduced if the chips are mounted into the same package.

It will be appreciated that the actual hybrid package may include more than one chip of the same type, particularly if large-area chips of a certain type are not readily available. As an example, a co-package may include a single IGBT chip and two or more WBG switches. As another example, it may include an IGBT and a cascode circuit, which comprises a normally-on low-voltage silicon MOSFET chip and a high-voltage normally-off WBG switch, as shown in FIG. 4.

Figure 5:
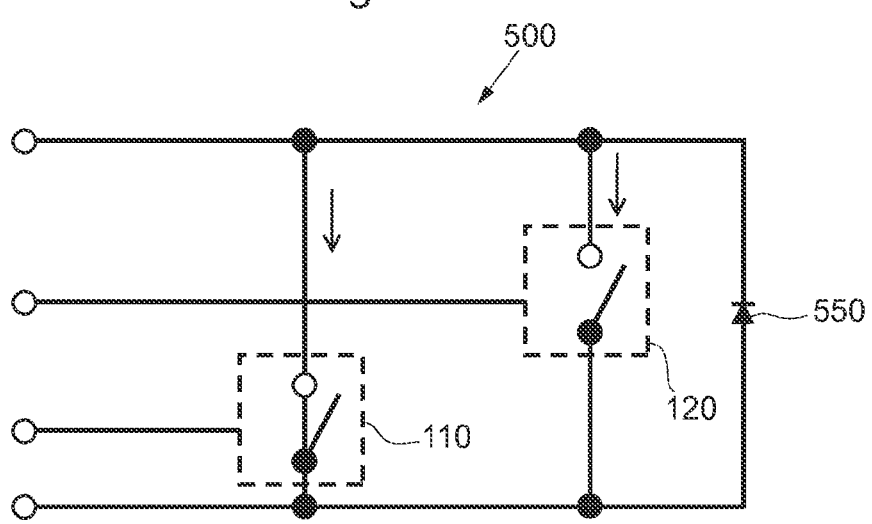
FIG. 5 shows a circuit including a composite switch provided with an antiparallel rectifier diode according to an embodiment.

It is a further advantage to have principal and snubber switch co-packaged together with an anti-parallel rectifier diode, as shown in FIG. 5. FIG. 5 shows a switching circuit 500 equivalent to the switching circuit 100 described above with reference to FIG. 1 except that it further comprises an anti-parallel rectifier diode 550. In FIG. 5, arrows indicate the current flow direction in the switches as the switches may not be unidirectional. The anti-parallel rectifier diode 550 may be part of so-called half-bridge and full-bridge circuits that are widespread in switch-mode power conversion technology. Such hybrid assembly could preferably be mounted on a insulating ceramic carrier so as to electrically insulate the heat sink.

A half-bridge circuit includes two switches, each having an antiparallel diode. A full bridge conversion circuit may include four switches or components for two-phase applications or six switches or components for 3-phase applications.

A co-packaged composite switch may contain at least three chips, namely a principal Si bipolar switch, a snubber WBG switch and an anti-parallel high voltage rectifier diode. The voltage and current rating of the rectifier diode may preferably be close to those for the principal silicon bipolar switch. The anti-parallel diode may be a high voltage high power p-i-n silicon diode. More preferably, the rectifier diode 550 may be a silicon carbide or GaN Schottky-barrier rectifier. Silicon carbide Schottky-barrier rectifiers may have very low stored charge, which is an advantage from the viewpoint of minimizing (or at least reducing) the switching losses.

According to an embodiment, it is advantageous if the SiC or GaN Schottky-barrier rectifier is complemented with a silicon carbide p-i-n diode, the Schottky and the p-i-n rectifiers having the same polarity. The SiC p-i-n rectifier has a higher forward voltage drop than a Schottky rectifier under nominal operation conditions; however, its forward voltage drop does not increase with the current as fast as that of a Schottky rectifier. The SiC p-i-n rectifier is therefore more stable to surge current than the SiC Schottky rectifier. The p-i-n SiC rectifier may be provided in a hybrid package as a separate chip. Even more advantageously, a Schottky rectifier merged with a p-i-n diode may be arranged in the same chip, which would decrease the total chip count.

It is also advantageous if the hybrid assembly includes six independent composite switches with the antiparallel diodes connected as shown in FIG. 5. It will be appreciated that such a 6-switch assembly may be arranged on an insulating ceramic substrate. The 6-swich hybrid assembly will then include all high power devices required for a 3-phase switch-mode power converter.

Certain 2-voltage level full bridge configurations may require that only half of the switching components are run or operated at a high switching frequency, whereas the other half may be run or operated at a power line frequency of 50 Hz or 60 Hz. It will be appreciated that such 2-voltage level configuration may require composite switches according to embodiments only for the half running at a high switching frequency.

In one general aspect, a switching circuit for power conversion applications can include a first silicon-based bipolar switching device and a second switching device including a wide bandgap semiconductor where the first and second switching device are connected in parallel. The switching circuit can be configured for high power high voltage switching applications.

In some implementations, the first switching device is a silicon bipolar junction transistor and the second switching device includes at least one of a SiC bipolar junction transistor, a SiC junction field-effect transistor, a SiC metal semiconductor field-effect transistor, a SiC metal-oxide-semiconductor field-effect transistor, a SiC insulated gate bipolar transistor and a GaN-based heterojunction field-effect transistor.

In some implementations, the second switching device includes a cascode circuit comprising a wide bandgap field-effect transistor, preferably normally on, and a low-voltage silicon MOSFET, preferably normally off.

In some implementations, the low-voltage silicon MOSFET has a source terminal and a drain terminal clamped by a Zener diode.

In some implementations, the first switching device is implemented in a first chip and the second switching device is implemented in a second chip, said chips being arranged as a hybrid assembly in a package.

In some implementations, further includes an antiparallel rectifier diode.

In another general aspect, a switching system can include at least two switching devices as defined in any combination of the elements above.

In some implementations, a controller circuit connectable to a switching circuit or a switching system as defined above can be configured to activate the second switching device during turn-on and/or turn-off of the first switching device.

In some implementations, the controller circuit is configured to activate the second switching device during turn-off of the first switching device at least during a period corresponding to one to several times the lifetime of minority carriers in the first switching device.

In some implementations, the controller circuit is configured to, upon turn-on of the first switching device, activate the second switching device for a period lasting at least one quarter of time, and preferably for a period equal to, the turn-on period of the first switching device.

In some implementations, the controller circuit can be configured to increase duration of the turn-on period of the second switching device with increase of the junction temperature of the first switching device.

In some implementations, a switch-mode electrical power conversion device includes a switching circuit or switching system as defined above and a controller circuit as defined above.

In some implementations, the controller circuit further comprises a current sensing probe for detecting short circuits.

In conclusion, new designs of high power switching circuits and controller circuits are provided. A principal silicon bipolar switch is connected in parallel to a snubber switch that is formed of a wide bandgap material. The snubber switch is activated during turn-on and/or turn-off of the principal silicon switch so as to minimize the switching loss and to bypass safe operation area limitations.

Even though the embodiments have been described with reference to specific exemplifying embodiments thereof, many different alterations, modifications and the like will become apparent for those skilled in the art. The described embodiments are therefore not intended to limit the scope of the embodiments, as defined by the appended claims.

What is claimed is:

1. A switching circuit, comprising:
a first switching device, the first switching device being a silicon-based bipolar switching device;
a second switching device including a wide bandgap semiconductor, the first switching device, the second switching device including a cascode circuit and a low-voltage silicon metal-oxide-semiconductor field-effect transistor (MOSFET), the low-voltage silicon MOSFET having a source terminal and a drain terminal both clamped by a Zener diode; and
a controller circuit configured to trigger the second switching device before triggering at least one of turn-on or turn-off of the first switching device such that the second switching device is activated during at least one of turn-on or turn-off of the first switching device.

2. The switching circuit of claim 1, being configured to operate within a high power high voltage switching application.

3. The switching circuit of claim 1, wherein the first switching device includes a silicon bipolar junction transistor and the second switching device includes at least one of a silicon carbide (SiC) bipolar junction transistor, a SiC junction field-effect transistor, a SiC metal semiconductor field-effect transistor, a SiC metal-oxide-semiconductor field-effect transistor, a SiC insulated gate bipolar transistor and a GaN-based heterojunction field-effect transistor.

4. The switching circuit of claim 1, wherein the first switching device is included in a first chip and the second switching device is included in a second chip, the first chip and the second chip being included in a hybrid assembly in a package.

5. The switching circuit of claim 1, further comprising an antiparallel rectifier diode.

6. A switching system, comprising at least two switching circuits as defined in claim 1.

7. A switching circuit, comprising:
a first silicon-based bipolar switching device;
a second switching device including a wide bandgap semiconductor, the first switching device and second switching device being connected in parallel; and
a controller circuit operatively coupled to the switching circuit, the controller circuit being configured to trigger the second switching device before triggering at least one of turn-on and turn-off of the first switching device such that the second switching device is activated during the at least one of the turn-on and the turn-off of the first switching device.

8. The switching circuit of claim 7, wherein the controller circuit is configured to activate the second switching device during turn-off of the first switching device at least during a time period corresponding to at least one lifetime of a minority carrier in the first switching device.

9. The switching circuit of claim 7, wherein the controller circuit is configured to, upon turn-on of the first switching device, activate the second switching device for a time period lasting at least one quarter of a turn-on period of the first switching device.

10. The switching circuit of claim 7, wherein the controller circuit is configured to increase a duration of a turn-on period of the second switching device with an increase of a junction temperature of the first switching device.

11. The switching circuit of claim 7, wherein the switching circuit and the controller circuit are included in a switch-mode electrical power conversion device.

12. The switching circuit of claim 7, wherein the switching circuit is configured to operate within a high power high voltage switching application.

13. The switching circuit of claim 7, wherein the first switching device includes a silicon bipolar junction transistor and the second switching device includes at least one of a silicon carbide (SiC) bipolar junction transistor, a SiC junction field-effect transistor, a SiC metal semiconductor field-effect transistor, a SiC metal-oxide-semiconductor field-effect transistor, a SiC insulated gate bipolar transistor and a GaN-based heterojunction field-effect transistor.

14. The switching circuit of claim 7, wherein the second switching device includes a cascode circuit including a wide bandgap field-effect transistor, and a low-voltage silicon MOSFET.

15. The switching circuit of claim 14, wherein the low-voltage silicon MOSFET has a source terminal and a drain terminal both clamped by a Zener diode.

16. The switching circuit of claim 7, wherein the first switching device is included in a first chip and the second switching device is included in a second chip, the first chip and the second chip being included in a hybrid assembly in a package.

17. The switching circuit of claim 7, wherein the switching circuit further includes an antiparallel rectifier diode.

18. The switching circuit of claim 7, wherein the controller circuit further includes a current sensing probe for detecting short circuits.

19. The switching circuit of claim 7, wherein the second switching device is in an off-state between the turn-on of the first switching device and the turn-off of the first switching device.

* * * * *